US011845251B2

(12) United States Patent
Xu et al.

(10) Patent No.: US 11,845,251 B2
(45) Date of Patent: Dec. 19, 2023

(54) PREPARATION DEVICE AND PROCESS FOR ANISOTROPIC CONDUCTIVE FILM (ACF) BONDING STRUCTURE

(71) Applicant: JIANGSU TELILAN COATING TECHNOLOGY CO., LTD., Wuxi (CN)

(72) Inventors: Zhengliang Xu, Wuxi (CN); Liang Zheng, Wuxi (CN); Zheng Xu, Wuxi (CN)

(73) Assignee: JIANGSU TELILAN COATING TECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 18/020,953

(22) PCT Filed: Nov. 17, 2021

(86) PCT No.: PCT/CN2021/131082
§ 371 (c)(1),
(2) Date: Feb. 13, 2023

(87) PCT Pub. No.: WO2023/019775
PCT Pub. Date: Feb. 23, 2023

(65) Prior Publication Data

US 2023/0256723 A1 Aug. 17, 2023

(30) Foreign Application Priority Data

Aug. 17, 2021 (CN) ......................... 202110945923.4

(51) Int. Cl.
*B32B 37/10* (2006.01)
*B32B 7/12* (2006.01)
(Continued)

(52) U.S. Cl.
CPC ................ *B32B 37/10* (2013.01); *B32B 7/12* (2013.01); *B32B 15/08* (2013.01);
(Continued)

(58) Field of Classification Search
CPC ....... B32B 37/10; B32B 37/1207; B32B 7/12; B32B 15/08; B32B 2457/08;
(Continued)

(56) References Cited

U.S. PATENT DOCUMENTS

2001/0015495 A1 8/2001 Brofman et al.
2017/0311492 A1* 10/2017 Sueno ................ H05K 13/0404

FOREIGN PATENT DOCUMENTS

CN 101393332 A 3/2009
CN 201493916 U 6/2010
(Continued)

*Primary Examiner* — John L Goff, II
(74) *Attorney, Agent, or Firm* — Bayramoglu Law Offices LLC

(57) ABSTRACT

A preparation device and a process for an anisotropic conductive film (ACF) bonding structure are provided. The preparation device includes a negative-pressure adsorption device, a positioning assembly, and a hot-pressing module, where the negative-pressure adsorption device is configured to adsorb a first metal plate; the positioning assembly includes a first positioning module, at least two second positioning modules, and at least one third positioning module; and the hot-pressing module is configured to release a hot-pressing pressure, such that the second metal plate is connected to the first metal plate through an ACF to form a bonding structure. The present disclosure ensures reference positioning of the negative-pressure adsorption device on a mounting plate through the second positioning modules. The present disclosure further ensures that a side of the first metal plate is fully adhered to a side surface of an adsorption plate through the first positioning module.

17 Claims, 15 Drawing Sheets

(51) Int. Cl.

| | |
|---|---|
| ***B32B 15/08*** | (2006.01) |
| ***B32B 37/12*** | (2006.01) |
| *H01R 4/04* | (2006.01) |
| *H01R 12/61* | (2011.01) |
| *H01R 43/00* | (2006.01) |

(52) U.S. Cl.
CPC ...... *B32B 37/1207* (2013.01); *B32B 2457/08* (2013.01); *H01R 4/04* (2013.01); *H01R 12/61* (2013.01); *H01R 43/007* (2013.01)

(58) Field of Classification Search
CPC ............ B32B 38/1833; B32B 38/1841; B32B 38/1858; H01R 4/04; H01R 12/61; H01R 43/007; B29C 65/30; B29C 65/7808; B29C 65/7811; B29C 65/7844; B29C 65/7847; B29C 66/81411; B29C 66/81431; H05K 3/323
USPC .............................................. 156/285, 583.1
See application file for complete search history.

(56) References Cited

FOREIGN PATENT DOCUMENTS

| | | | | |
|---|---|---|---|---|
| CN | 102381008 | A | | 3/2012 |
| CN | 103687470 | A | | 3/2014 |
| CN | 103909719 | A | | 7/2014 |
| CN | 205176427 | U | * | 4/2016 |
| CN | 108891120 | A | | 11/2018 |
| CN | 109188736 | A | | 1/2019 |
| CN | 111421834 | A | | 7/2020 |
| CN | 111497257 | A | | 8/2020 |
| CN | 213108249 | U | | 5/2021 |
| CN | 213276190 | U | | 5/2021 |
| CN | 113900291 | A | | 1/2022 |
| JP | 2006162157 | A | | 6/2006 |
| JP | 2007035546 | A | * | 2/2007 |
| JP | 2008229767 | A | * | 10/2008 |
| KR | 20170045755 | A | | 4/2017 |

* cited by examiner

PREPARATION DEVICE AND PROCESS FOR ANISOTROPIC CONDUCTIVE FILM (ACF) BONDING STRUCTURE

CROSS REFERENCE TO THE RELATED APPLICATIONS

This application is the national phase entry of International Application No. PCT/CN2021/131082, filed on Nov. 17, 2021, which is based upon and claims priority to Chinese Patent Application No. 202110945923.4, filed on Aug. 17, 2021, the entire contents of which are incorporated herein by reference.

TECHNICAL FIELD

The present disclosure relates to the technical field of electronic product preparation, and in particular to a preparation device and process for an anisotropic conductive film (ACF) bonding structure.

BACKGROUND

Contact conductance is widely used for metal components of electronic products to achieve electromagnetic shielding. Generally, a contact conductance region is formed on the surface of the metal component by electroplating or conductive tape bonding. The advantages and disadvantages of the two solutions are as follows. (1) The electroplating solution has the advantages of high electrical conductivity, low contact resistance, high performance stability and reliability, but it is not environmentally friendly, complicated in process, and high in cost. (2) The conductive tape bonding solution is environmentally friendly, simple in process, and low in cost, but it has low electrical conductivity, poor thermal conductivity, and low performance stability.

The ACF is composed of high-quality resin and conductive particles. It is mainly used in a process where there is no way to perform high-temperature lead-tin soldering on the electronic circuit board, that is, the conventional bonding process. The conventional bonding process involves the connection of a flexible circuit board or flexible cable to a liquid crystal display (LCD), the connection of a flexible circuit board or flexible cable to a printed circuit board (PCB), the connection of a flexible circuit board or flexible cable to a membrane switch, or the connection of a flexible circuit board to a flexible circuit board.

Generally, the ACF is required to be effectively attached to the surface of ordinary steel, stainless steel, aluminum, aluminum alloy, copper, and other metal structural parts. However, at present, the following problems are likely to occur when the ACF is hot-pressed.

(1) The metal structural part is easy to deviate during production, which makes the ACF prone to positional defects and warping deformation during hot-pressing, thus leading to an increase in the rate of defective products.

(2) It is not easy to determine the relative position of the ACF and the metal structural part.

(3) When the ACF and the metal structural part are hot-pressed, stress concentration is easy to occur, resulting in distortion of the ACF after hot-pressing.

(4) It is hard to ensure stress balance when the ACF and the metal structural part are hot-pressed, resulting in poor bonding and indentation formation between the ACF and the metal structural part, and even large deformation of the hot-pressing junction between the ACF and the metal structural part in severe cases.

SUMMARY

An objective of the present disclosure is to provide a preparation device and process for an anisotropic conductive film (ACF) bonding structure to solve most if not all of the problems existing in the prior art.

In order to achieve the above objective, the present disclosure adopts the following technical solutions.

The preparation device for an ACF bonding structure includes a negative-pressure adsorption device, a positioning assembly, and a hot-pressing module, where the negative-pressure adsorption device is configured to adsorb a first metal plate, and includes an adsorption plate and multiple vacuum adsorption holes provided in the adsorption plate; and the vacuum adsorption holes are jointly connected to a vacuum generating device through a vacuum channel;

the positioning assembly includes a first positioning module, at least two second positioning modules, and at least one third positioning module; the first positioning module is configured to position the first metal plate; the second positioning modules are configured to position at least one part of the negative-pressure adsorption device; and the third positioning module is configured to position a second metal plate; and the hot-pressing module is configured to release a hot-pressing pressure, such that the second metal plate is connected to the first metal plate through an ACF to form a bonding structure.

Further, the hot-pressing module includes a part connected to a fine adjustment mechanism; the fine adjustment mechanism enables the hot-pressing module to release the hot-pressing pressure in a balanced state, and includes a first plate and a second plate connected to the first plate; the second plate is connected to a third plate; a first balancing member is connected between the first plate and the second plate; and a second balancing member is connected between the second plate and the third plate.

Further, the first balancing member includes at least a first shaft provided along a short side or a long side of the first plate; and the second balancing member includes at least a second shaft provided along a short side or a long side of the second plate.

Further, the first balancing member is a first sphere provided between the first plate and the second plate and located at a center of the first plate and the second plate; and the second balancing member is a second sphere provided between the second plate and the third plate and located at a center of the second plate and the third plate.

Further, the hot-pressing module includes a heat insulation part with an opening; the opening of the heat insulation part is closed by a heat conduction element; an enclosed space is formed between an inner side of the heat insulation part and an inner side of the heat conduction element, and is provided therein with a heating element; the heating element is provided therein with at least one heating tube; the heating tube includes a part connected to the heat insulation part and another part connected to the heating element; an interior of the heating tube is further connected to a thermocouple; and a thermal conductive silica gel film is provided at a connection between the heating element and the heat conduction element.

Further, the vacuum adsorption holes each include a first hole and a second hole communicated with the first hole; and a diameter of the first hole increases towards the second hole.

Further, the negative-pressure adsorption device and the positioning assembly are arranged on a mounting plate; the mounting plate is connected to a first moving plate; the first moving plate is connected to a part of at least two first pneumatic sliding tables; another part of the at least two first pneumatic sliding tables is connected to a bottom plate; and the first moving plate is further connected to an output end of a driving device through a transmission mechanism.

Further, the first positioning module includes a second pneumatic sliding table and a first piston connecting plate connected to a part of the second pneumatic sliding table; the first piston connecting plate includes one part connected to a first cylinder body and the other part connected to one part of a fixed plate, and the other part of the fixed plate is connected to a first positioning element and at least one second positioning element; a width of the second positioning element is smaller than a width of the first positioning element; the first positioning element and the second positioning element are connected to an orientation plate; and the orientation plate is provided with at least one positioning hole; and Further, the second positioning modules each include a second cylinder body and a third pneumatic sliding table connected to the second cylinder body; a part of the third pneumatic sliding table is connected to a piston through a second piston connecting plate; and the second piston connecting plate is connected to a positioning plate.

Further, the fine adjustment mechanism further includes a part connected to a second moving plate; left and right sides of the second moving plate each are connected to a fifth pneumatic sliding table; a surface of the second moving plate is connected to a pressing piston through a punch; an outer side of the pressing piston is provided with a guide seat; and the pressing piston is connected to a pressing cylinder.

Correspondingly, the present disclosure further provides a preparation process for an ACF bonding structure, which uses the above preparation device, and includes the following steps:

adsorbing, by the negative-pressure adsorption device, the first metal plate;

positioning, by the orientation plate, a transfer film with the ACF; covering, by the transfer film with the ACF, a surface of the first metal plate; and tearing off the transfer film, such that the ACF covers the surface of the first metal plate;

prepressing, by the hot-pressing module, the ACF, such that the ACF is bonded with the first metal plate;

covering, by the second metal plate, a surface of the ACF;

pressing, by the hot-pressing module, the second metal plate, such that the second metal plate, the ACF, and the first metal plate are hot-pressed to form a bonding structure; and taking the bonding structure out.

Further, alternatively, the ACF is replaced with a thermosetting composite conductive film.

Compared with the prior art, the present disclosure has the following beneficial effects.

(1) The present disclosure ensures the reference positioning of the negative-pressure adsorption device on the mounting plate through the second positioning modules. The present disclosure further ensures that the side of the first metal plate is fully adhered to the side surface of the adsorption plate through the first positioning module, so as to prevent the first metal plate from deviating during subsequent hot-pressing. The present disclosure also reduces deformation of the side part of the first metal plate during hot-pressing, so as to avoid affecting the product yield.

(2) Further, the present disclosure realizes the relative positioning between the second metal plate and the first metal plate with the ACF before hot-pressing through the third positioning module, and releases the positioning after hot-pressing to further improve the hot-pressing effect.

(3) Further, the fine adjustment assembly is provided with the first balancing element and the second balancing element that ensure the flatness of the fine adjustment mechanism in the left-right direction and the front-back direction. In this way, the flatness and parallelism of the pressing part of the hot-pressing module are consistent, and the stress on the surface of the ACF is balanced after contacting the hot-pressing module, so as to avoid indentation during the hot-pressing process and effectively solve the problem of flatness variation of the bonding structure when the temperature changes from low to high.

(4) Further, the heating element has good high-temperature stability, and the heat insulation part further inhibits the upward heat conduction of the heating element and the heating tube, thus avoiding heat loss. The heat always flows downward and towards the heat conduction element, such that the heat of the heat conduction element is always kept within a reasonable range.

(5) Further, most part of the heating element is covered by the heating tube, which ensures the heat conduction performance of the heating element and the heating tube, such that heat can be quickly and stably transferred to the heat conduction element. The groove can also play a role of yielding and enabling point pressure contact for a bottom contact surface of the second part in the heat conduction element. In addition, the groove can further release local stress to avoid thermal stress deformation on the bonding structure during hot-pressing, thus improving the product yield.

(6) Since the airflow tube is made of a flexible material, a cone angle of the airflow tube is reduced when the airflow tube is pulled. Due to the reduction in the cone angle, a forward net force is generated on the suction flow. That is, the pressure in front of the airflow tube is less than the pressure behind. The work done by the pressure is converted into kinetic energy to ensure that the fluid is continuously accelerated, which increases the energy of the suction flow. The suction flow with increased energy passes through the vortex hole. Since the vortex hole is spiral, the suction flow with increased energy is gathered there and a vacuum vortex is generated. The vacuum vortex flows out of the vortex hole and then passes through the first hole, thus increasing the kinetic energy. Therefore, the first metal plate is adsorbed by a stable adsorption force, and the adsorption force will not damage the first metal plate, thus prolonging the service life of the first metal plate, without causing an adsorption mark on the surface of the first metal plate.

(7) The groove has the first notch and the second notch connected to the first notch, and the tapered transition port is provided between the first notch and the second notch. The width of the first notch is greater than that of the second notch. Through the first notch with a larger width, local normal-temperature gas below the temperature of the heat conduction element gathers at the first notch during downward hot-pressing. During further downward hot-pressing, the gas is accelerated at the tapered transition port and enters the second notch. The second notch with a smaller width contributes to the largest gas flow is and the lowest temperature. In this way, the gas is further cooled as a cooling gas to impact the surface of the part to be hot-pressed. It generates heat exchange with the surface of the part to be hot-pressed to generate temperature gradient, further releasing local stress, avoiding thermal stress deformation on the bonding structure during hot-pressing, thus improving the product yield.

Figure 1:
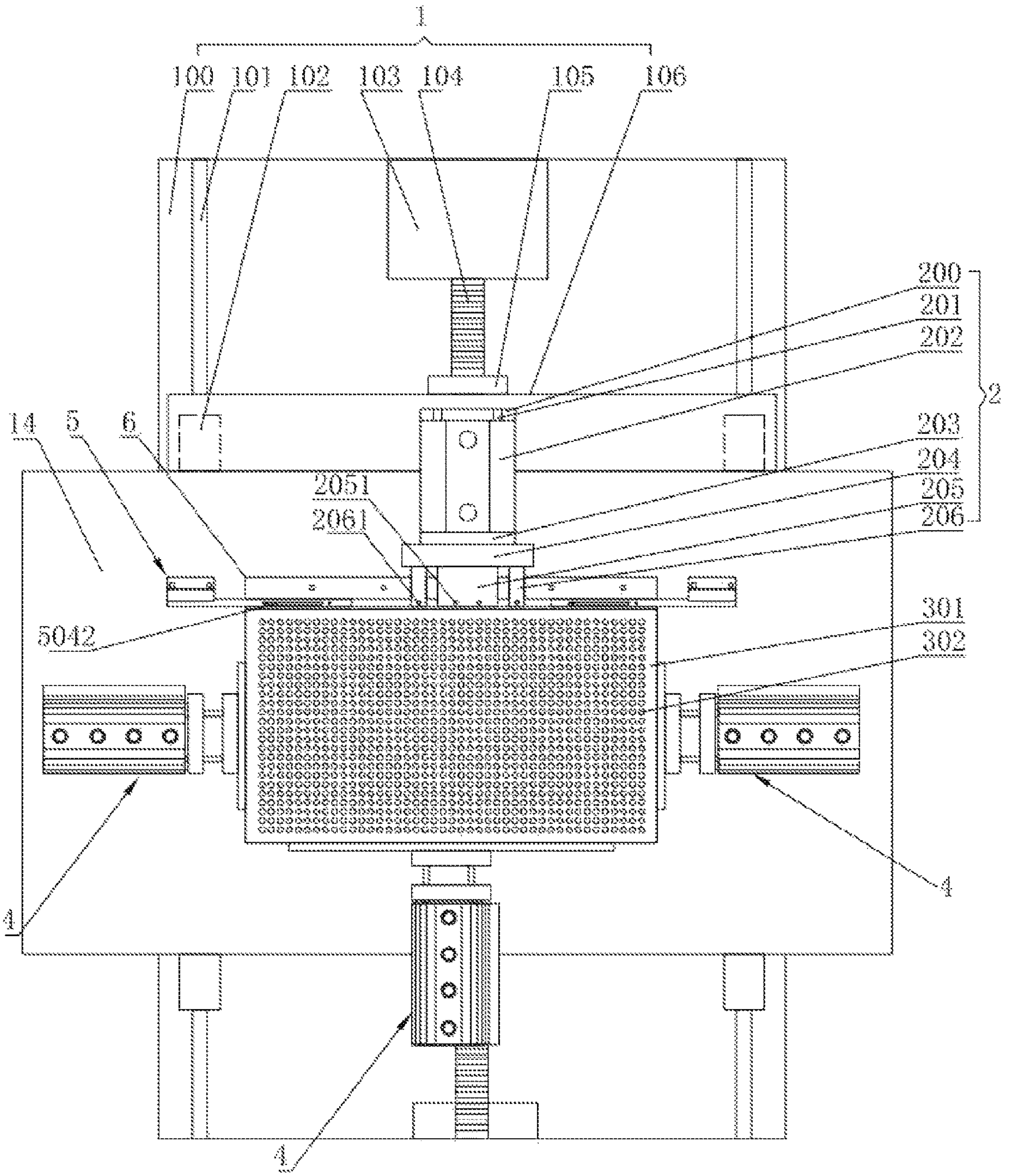
FIG. 1 is a schematic diagram of a positioning mechanism of a preparation device and process for an ACF bonding structure according to an embodiment of the present disclosure.

Reference Numerals: 1. transfer assembly; 100. bottom plate; 101. first guide rail; 102. first slider; 103. driving device; 104. screw rod; 105. nut; 106. first moving plate; 2. first positioning module; 200. first cylinder body; 201. second guide rail; 202. second slider; 203. first piston connecting plate; 204. fixed plate; 205. first positioning element; 2051. first positioning hole; 206. second positioning element; 2061. second positioning hole; 3. negative-pressure adsorption device; 301. adsorption plate; 302. vacuum adsorption hole; 3021. first hole; 30211. spacer; 30212. vortex hole; 30213. elastic element; 30210. airflow tube; 3022. second hole; 303. vacuum channel; 304. vacuum generating device; 4. second positioning module; 400. second cylinder body; 401. third guide rail; 402. third slider; 403. piston; 404. second piston connecting plate; 405. positioning plate; 5. third positioning module; 500. third cylinder body; 501. fourth slider; 502. fourth guide rail; 503. movable positioning post; 5031. first positioning part; 5032. second positioning part; 5033. movable part; 504. third positioning element; 5041. sliding groove; 5042. movable opening; 505. piston rod; 506. third piston connecting plate; 507. fixed positioning post; 6. orientation plate; 600. plate body; 601. third positioning hole; 602. first positioning groove; 603. second positioning groove; 700. pressing cylinder; 701. pressure gauge; 702. horizontal beam; 703. side plate; 704. vertical beam; 705. guide seat; 706. pressing piston; 707. punch; 708. fifth slider; 709. connecting plate; 710. second moving plate; 711. fifth guide rail; 712. guide plate; 8. fine adjustment mechanism; 800. first plate; 801. second plate; 802. third plate; 803. first short shaft; 804. first long shaft; 8051. second short shaft; 8061. second long shaft; 807. first sphere; 808. second sphere; 900. heat conduction element; 9001. first part; 9002. second part; 901. groove; 9011. first notch; 9012. second notch; 9013. transition port; 902. first heat insulation element; 903. second heat insulation element; 904. third heat insulation element; 905. heating element; 906. heating tube; 907. thermal conductive silica gel film; 9061. first tube; 9062. second tube; 908. thermocouple; 10. transfer film; 1001. transfer film positioning hole; 11. ACF; 12. first metal plate; 13. second metal plate; 1301. second metal plate positioning hole; and 14. mounting plate.

DETAILED DESCRIPTION OF THE EMBODIMENTS

To make the objectives, technical solutions, and advantages of the present disclosure clearer, the preparation device and process for an anisotropic conductive film (ACF) bonding structure provided by the present disclosure are described in further detail below with reference to the drawings and specific implementations. The advantages and features of the present disclosure will become more apparent from the following descriptions. It should be noted that the drawings are simplified and do not use an accurate proportion, that is, the drawings are only intended to conveniently and clearly assist in illustrating the implementations of the present disclosure. To make the objectives, features and advantages of the present disclosure clearer, the specific implementations of the present disclosure are described in detail below with reference to the drawings. The structure, scale, size, and the like shown in the drawings of this specification are only used to match the content disclosed in the specification and for those skilled in the art to understand and read, which are not used to limit the limitations for implementing the present disclosure and thus are not technically substantial. Any structural modification, scaling relation change, or size adjustment made without affecting the effects and objectives that can be achieved by the present disclosure should fall within the scope that can be encompassed by the technical content disclosed in the present disclosure.

Embodiment 1

In this embodiment, an ACF bonding structure mainly includes first metal plate 12, second metal plate 13, and ACF 11. The ACF 11 is located between the first metal plate 12 and the second metal plate 13. Preferably, in this embodiment, the first metal plate 12 of the ACF bonding structure is mainly a stainless steel plate, and the second metal plate 13 is mainly an aluminum plate.

In other embodiments of the present disclosure, the ACF can also be a thermosetting composite conductive film.

Figure 4:
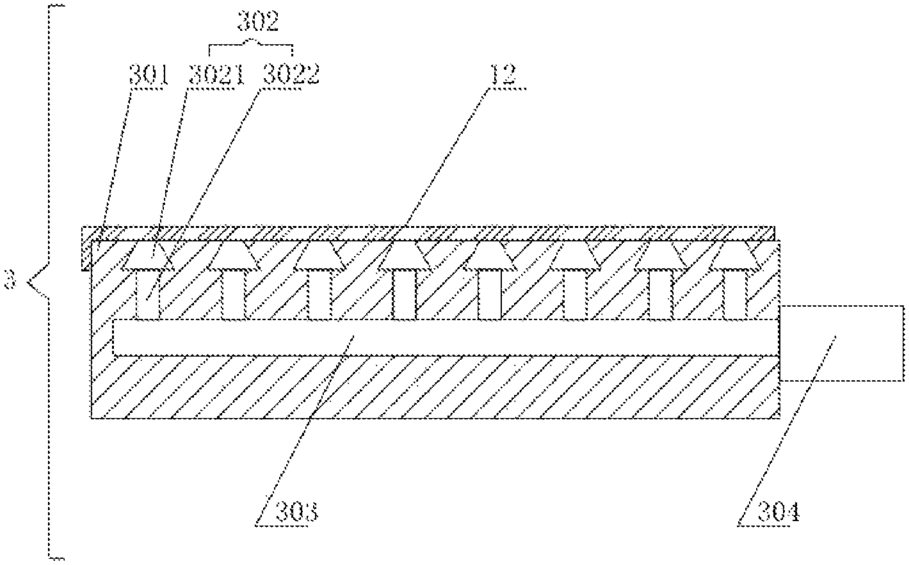
FIG. 4 is a section view of a negative-pressure adsorption device of the preparation device and process for an ACF bonding structure according to an embodiment of the present disclosure.
Figure 5:
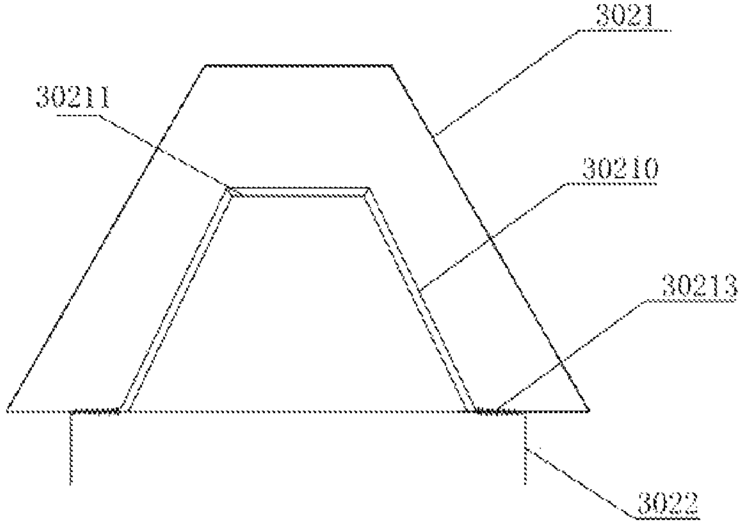
FIG. 5 is a schematic diagram of a first hole and an airflow tube of the preparation device and process for an ACF bonding structure according to an embodiment of the present disclosure.
Figure 6:
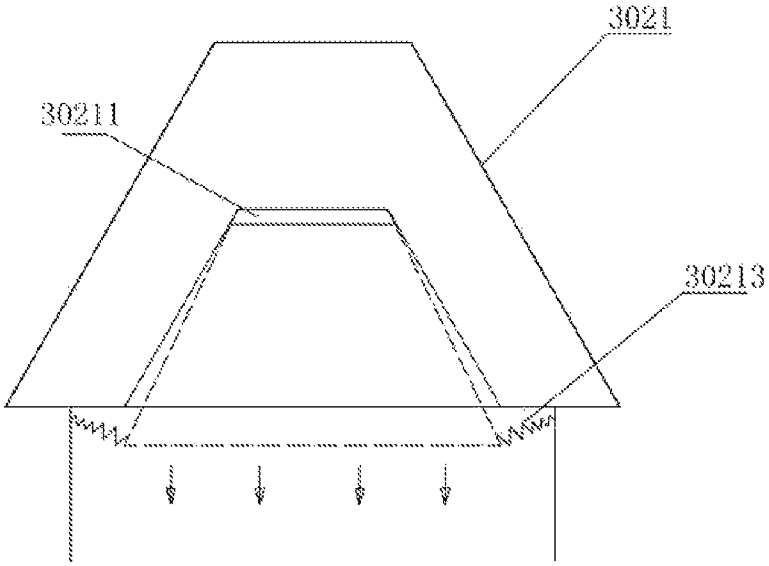
FIG. 6 is a schematic diagram of the airflow tube of the preparation device and process for an ACF bonding structure according to an embodiment of the present disclosure.
Figure 11:
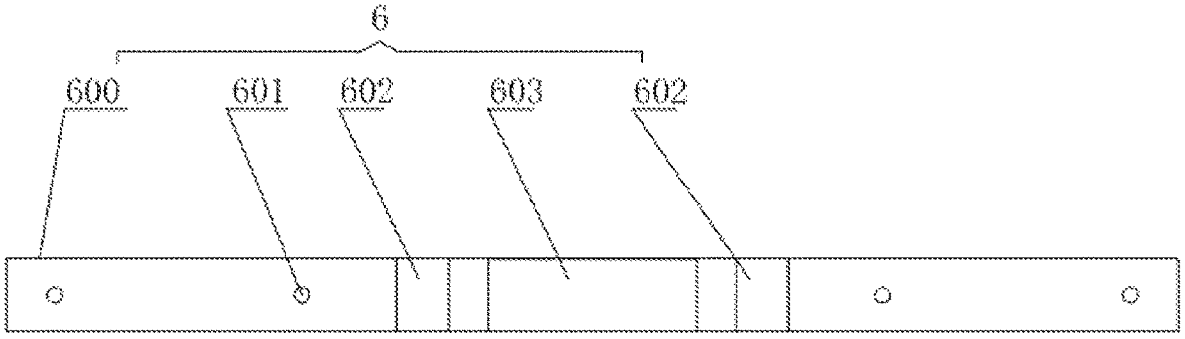
FIG. 11 is a schematic diagram of a support plate of the preparation device and process for an ACF bonding structure according to an embodiment of the present disclosure.

Referring to FIGS. 1, 4, and 11, a preparation device for an ACF bonding structure includes a negative-pressure adsorption device, a positioning assembly, and a hot-pressing module.

Referring to FIGS. 1 and 4, the negative-pressure adsorption device 3 is configured to adsorb the first metal plate 12. The negative-pressure adsorption device 3 includes adsorption plate 301. The adsorption plate 301 is a rectangular plate. A surface of the adsorption plate 301 is provided with multiple vacuum adsorption holes 302 arranged in an array. The vacuum adsorption holes 302 are connected to vacuum generating device 304 through vacuum channel 303. The vacuum generating device 304 is preferably a vacuum generator, which offers an adsorption force for the vacuum adsorption holes 302 through the vacuum channel 303 to adsorb the first metal platel2.

Referring to FIG. 1 and FIGS. 4 to 7, the vacuum adsorption holes 302 each include first hole 3021 and second hole 3022 communicated with the first hole 3021. The second hole 3022 is communicated with the vacuum channel 303. A diameter of the first hole 3021 decreases towards the surface of the adsorption plate 301, such that the first hole 3021 is formed into a tapered hole with a small top diameter and a large bottom diameter. The first hole 3021 is further provided therein with airflow tube 30210. The airflow tube 30210 is made of a flexible material. One end of the airflow tube 30210 is connected to a wall of the second hole 3022 through at least two elastic elements 30213. The elastic element 30213 may preferably be a tension spring. The other end of the airflow tube 30210 is connected to spacer 30211. The spacer 30211 is made of a compressible material. The spacer 30211 has vortex hole 30212.

Figure 7:
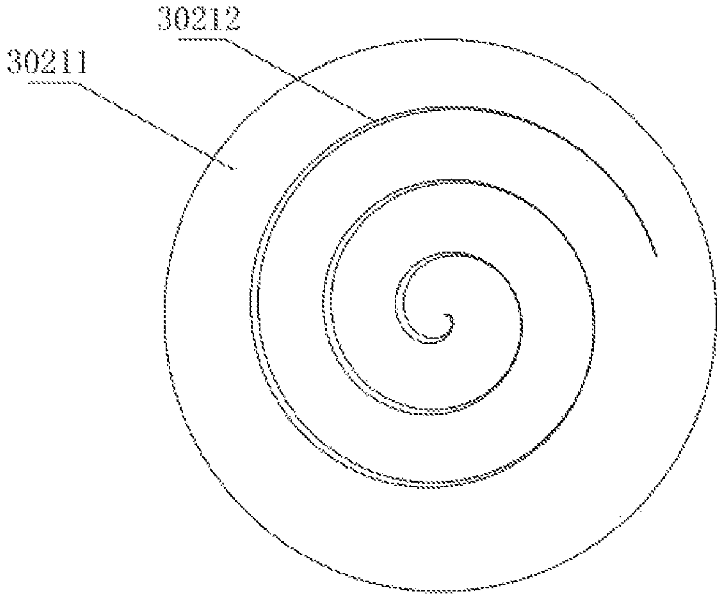
FIG. 7 is a schematic diagram of a spacer of the preparation device and process for an ACF bonding structure according to an embodiment of the present disclosure.

Further, referring to FIGS. 4 and 7, the airflow tube 30210 is a tapered tube with a small top diameter and a large bottom diameter. Through the setting of the airflow tube 30210, when the vacuum generating device 304 is working, a suction flow generated by the vacuum generating device 304 enters the second hole 3022. Since the airflow tube 30210 is connected to the wall of the second hole 3022 through the tension spring, the suction flow continuously pulls the airflow tube 30210 into the second hole 3022. Since the airflow tube 30210 is made of a flexible material, a cone angle of the airflow tube is reduced when the airflow tube 30210 is pulled. Due to the reduction in the cone angle, a forward net force is generated on the suction flow. That is, the pressure in front of the airflow tube is less than the pressure behind. The work done by the pressure is converted into kinetic energy to ensure that the fluid is continuously accelerated, which increases the energy of the suction flow. The suction flow with increased energy passes through the vortex hole 30212. Since the vortex hole 30212 is spiral, the suction flow with increased energy is gathered there and a vacuum vortex is generated. The vacuum vortex flows out of the vortex hole 30212 and then passes through the first hole 3021, thus increasing the kinetic energy. Therefore, the first metal plate 12 is adsorbed by a stable adsorption force, and the adsorption force will not damage the first metal plate 12, thus prolonging the service life of the first metal plate 12, without causing an adsorption mark on the surface of the first metal plate 12.

Still referring to FIG. 1, the specific structure of the positioning assembly is described in detail below.

The positioning assembly is provided on mounting plate 14, and includes first positioning module 2, at least two second positioning modules 4, and at least one third positioning module 5. In this embodiment, there are three second positioning modules 4 and one first positioning module 2 provided in the preparation device for an ACF bonding structure. The first positioning module 2 and the second positioning modules 4 are crisscross distributed around the adsorption plate 301.

The specific structure of the first positioning module 2 is described below.

Still referring to FIG. 1, the first positioning module is configured to position a long side of the first metal plate 12 and position the second metal plate 13 during a pressing process. Referring to FIG. 4, the first metal plate 12 is provided with a bent part, which needs to be butted against a side surface of the adsorption plate 301. Therefore, it is necessary to position the long side butted against the side surface of the adsorption plate 301 through the first positioning module 2, so as to avoid further deviation of the first metal plate 12 in the subsequent hot-pressing process.

Still referring to FIG. 1, the first positioning module 2 includes second pneumatic sliding table and first piston connecting plate 203 connected to a part of the second pneumatic sliding table. The second pneumatic sliding table includes second guide rails 201 and slider 202 connected to the second guide rails 201. There are two second guide rails 201 arranged on a surface of first cylinder body 200. A piston of the first cylinder body 200 is connected to the first piston connecting plate 203, and the first piston connecting plate 203 is connected to the second slider 202. In this way, the first cylinder body 200 drives the first piston connecting plate 203 to move when controlling the piston to extend, and the first piston connecting plate 203 drives the second slider 202 to slide along the second guide rails 201 when moving.

Further, still referring to FIG. 1, an outer end surface of the first piston connecting plate 203 is fixedly connected to an inner end surface of fixed plate 204. An outer end surface of the fixed plate 204 is fixedly connected to first positioning element 205 and two second positioning elements 206.

The two second positioning elements 206 are uniformly distributed around the first positioning element 205. The first positioning element 205 is provided with at least one first positioning hole 2051 for positioning the second metal plate 13, and the second positioning element 206 is provided with second positioning hole 2061 for positioning the second metal plate 13.

Further, still referring to FIG. 1, in order to achieve the stability of a force for positioning a side of the first metal plate 12, the first positioning element 205 and the two second positioning elements 206 are arranged to perform three-point positioning. A width of the second positioning element 206 is smaller than a width of the first positioning element 205, so the first positioning element 205 performs large-area primary positioning of the side of the first metal plate 12. In this way, most of the area of the side of the first metal plate 12 is butted against a side surface of the adsorption plate 301, and the second positioning element 206 performs small-area auxiliary positioning for the side of the first metal plate 12. The side of the first metal plate 12 is fully adhered to the side surface of the adsorption plate 301 to avoid its deviation in the subsequent hot-pressing process.

Further, the first positioning element 205 and the second positioning element 206 also ensure that the side part of the first metal plate 12 has a low deformation during hot-pressing, so as to prevent the first metal plate from deforming during hot-pressing to affect the product yield.

Further, referring to FIGS. 1 and 11, in order to achieve the guidance of the first positioning element 205 and the second positioning elements 206 in the moving process, the mounting plate 14 is further fixedly connected to the orientation plate 6. There is a gap between the orientation plate 6 and the adsorption plate 301. The orientation plate 6 is provided with second positioning groove 603 matched with the first positioning element 205 in terms of size and first positioning groove 602 matched with the second positioning element 206 in terms of size. In order to ensure that the transfer film 10 with the ACF is positioned with the first metal plate 12, the orientation plate 6 is further provided with multiple third positioning holes 601. The position of the third positioning hole 601 corresponds to the position of transfer film positioning hole 1001 of the transfer film 10.

The specific structure of the second positioning module 4 is described below.

Figure 2:
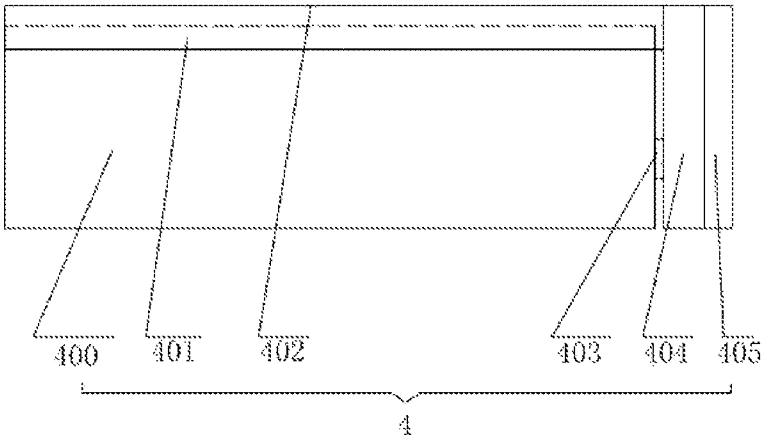
FIG. 2 is a schematic diagram of a first positioning module, in a static state, of the preparation device and process for an ACF bonding structure according to an embodiment of the present disclosure.
Figure 3:
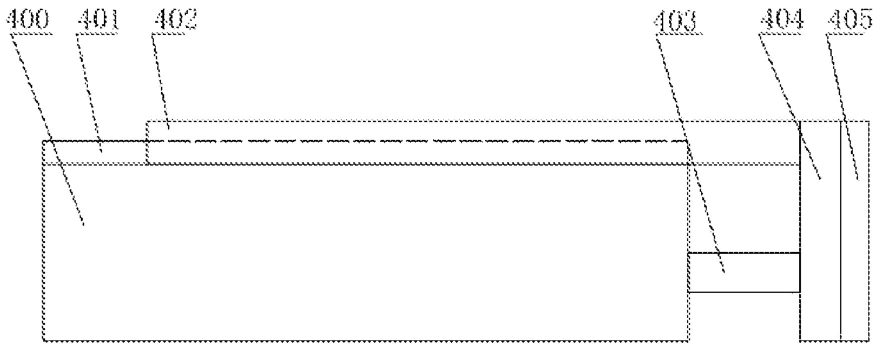
FIG. 3 is a schematic diagram of the first positioning module, in a moving state, of the preparation device and process for an ACF bonding structure according to an embodiment of the present disclosure.

Referring to FIGS. 1, 2 and 3, each second positioning module 4 includes second cylinder body 400 and third pneumatic sliding table connected to the second cylinder body 400. The third pneumatic sliding table includes at least one third guide rail 401 and third slider 402 slidably connected to each third guide rail 401. The third slider 402 is slidable along each third guide rail 401. Each third guide rail 401 is provided on a surface of the second cylinder body 400. The third slider 402 is connected to an upper half of second piston connecting plate 404, and a lower half of the second piston connecting plate 404 is connected to the second cylinder body 400 through piston 403. The second cylinder body 400 controls the extension and retraction of the piston 403, thereby controlling the sliding of the second piston connecting plate 404 and the third slider 402 relative to the third guide rail 401. An outer side of the second piston connecting plate 404 is connected to positioning plate 405.

Referring to FIG. 1, in each second positioning module 4, each positioning plate 405 has the same or different lengths. In this embodiment, in the preparation device for an ACF bonding structure, the positioning plates 405 of the second positioning modules 4 located at the two short sides of the adsorption plate 301 have the same length. The length of the positioning plate 405 of the second positioning module 4 located at the long side of the adsorption plate 301 is greater than the length of the positioning plate 405 located at the short side. The three second positioning modules 4 can serve as a basis for mounting the adsorption plate 301, so as to achieve accurate positioning of the adsorption plate 301.

The specific structure of the third positioning modules 5 is described in detail below.

Figure 8:
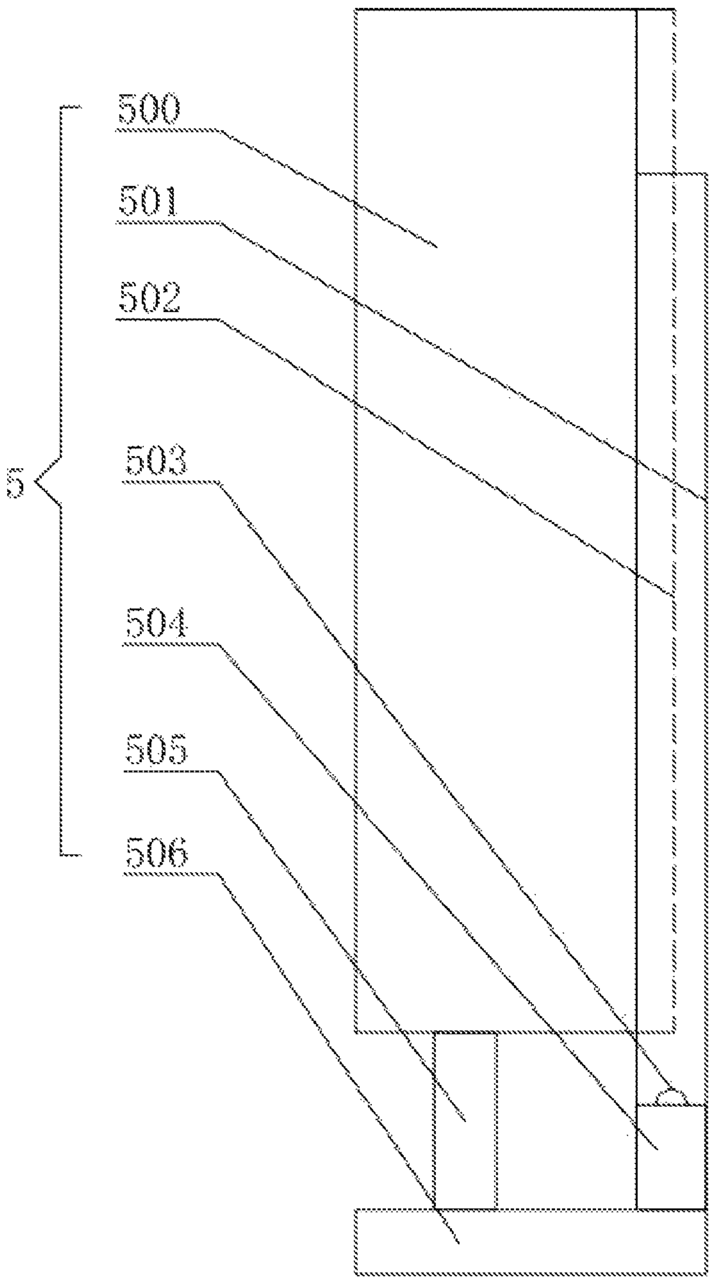
FIG. 8 is a side view of a third positioning module of the preparation device and process for an ACF bonding structure according to an embodiment of the present disclosure.
Figure 9:
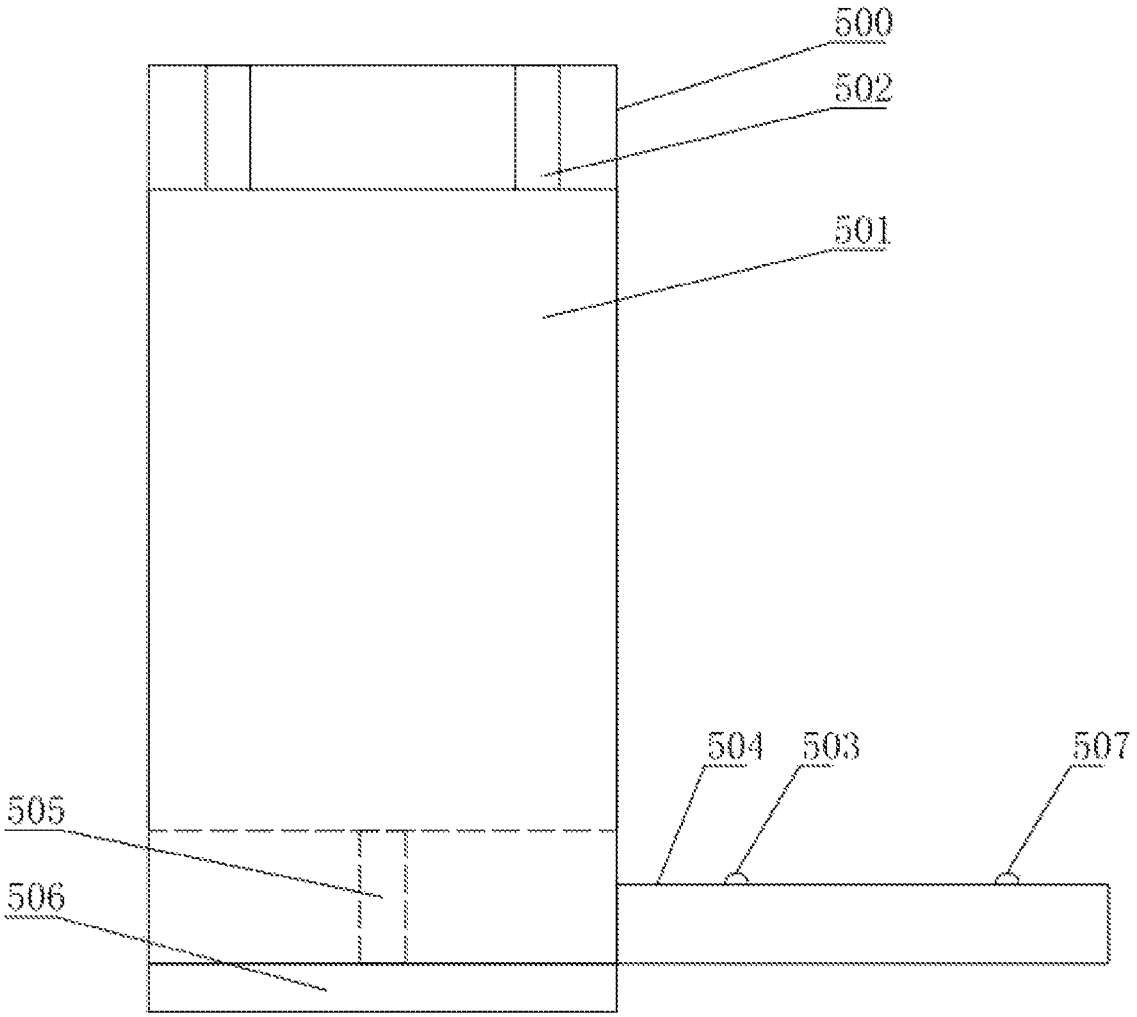
FIG. 9 is a front view of the third positioning module of the preparation device and process for an ACF bonding structure according to an embodiment of the present disclosure.

Referring to FIGS. 1, 8, and 9, there are two third positioning modules symmetrically arranged with the orientation plate 6 as a center. The third positioning modules 5 each include a fourth pneumatic sliding table and third piston connecting plate 506 connected to a part of the fourth pneumatic sliding table. The third piston connecting plate 506 is connected to third cylinder body 500 through piston rod 505. The fourth pneumatic sliding table includes at least one fourth guide rail 502 and fourth sliding table 501 connected to the fourth guide rail 502. An end of the fourth sliding table 501 is connected to the third piston connecting plate 506.

Further, referring to FIGS. 8 and 9, before hot-pressing, it is necessary to realize the position correspondence and positioning of the second metal plate 13, the ACF 11, and the first metal plate 12. Therefore, a side surface of the fourth sliding table 501 is connected to third positioning element 504. The third positioning element 504 is provided with fixed positioning post 507 and movable positioning post 503. The movable positioning post 503 is movable relative to the fixed positioning post 507 to adjust a relative distance between the movable positioning post 503 and the fixed positioning post 507.

Figure 10:
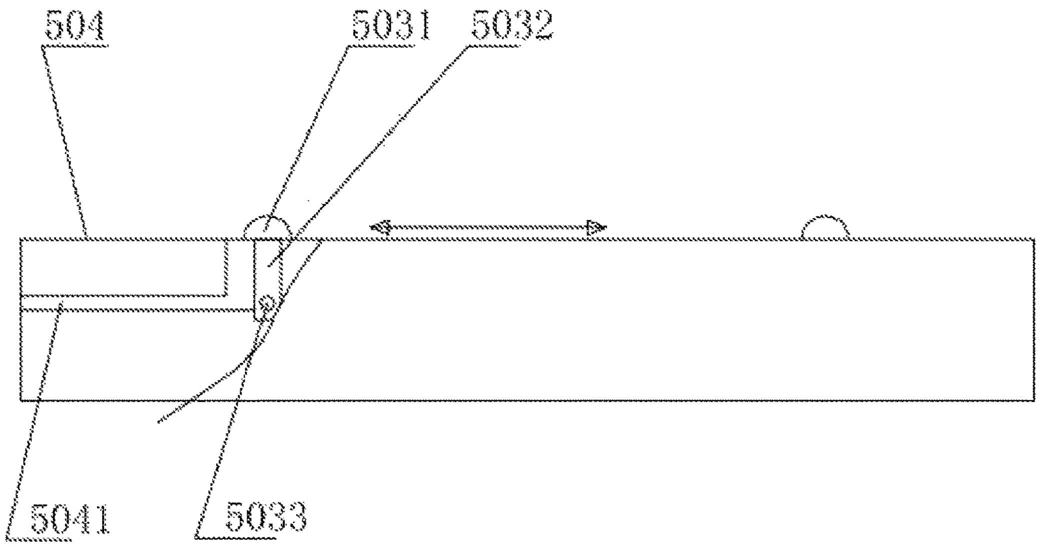
FIG. 10 is a partial view of the third positioning module of the preparation device and process for an ACF bonding structure according to an embodiment of the present disclosure.

Further, referring to FIG. 10, the third positioning element 504 is axially provided therein with sliding groove 5041. The movable positioning post 503 includes first positioning part 5031 and second positioning part 5032 connected to the first positioning part 5031. An outer side of the second positioning part 5032 is provided with movable part 5033 that is slidable along the sliding groove 5041. An area of the first positioning part 5031 is larger than an area of the second positioning part 5032. A surface of the third positioning element 504 is further provided with movable opening 5042. A width of the movable opening is smaller than a diameter of the first positioning part 5031, such that the first positioning part 5031 is always supported on the surface of the third positioning element 504 to slide back and forth. To ensure the accurate positioning of the movable part 5033 in the sliding groove 5041, a height of the sliding groove 5041 is slightly smaller than a diameter of the movable part 5033. In this way, the movable part 5033 can be further clamped in the sliding groove 5041, and the movable part 5033 can move in the sliding groove 5041.

Still referring to FIG. 1, the negative-pressure adsorption device, the first positioning module 2, the second positioning modules 4, and the third positioning module 5 are arranged on the mounting plate 14. The mounting plate 14 is connected to transfer assembly 1. The transfer assembly 1 includes bottom plate 100. The bottom plate 100 is provided with at least two first pneumatic sliding tables. The first pneumatic sliding table includes first guide rails 101 and first sliders 102 slidably connected to the first guide rails 101 respectively. Each first slider 102 is mounted at a bottom of the first moving plate 106. A bottom center of the first moving plate 106 is further connected to a transmission mechanism. The transmission mechanism is specifically a screw nut transmission mechanism, which mainly includes screw rod 104 and nut 105 threaded with the screw rod 104. The nut 105 is connected to the first moving plate 106. The screw rod 104 includes one end connected to a screw rod seat and the other end connected to an output end of driving device 103. Preferably, the driving device 103 is a reduction motor.

Figure 12:
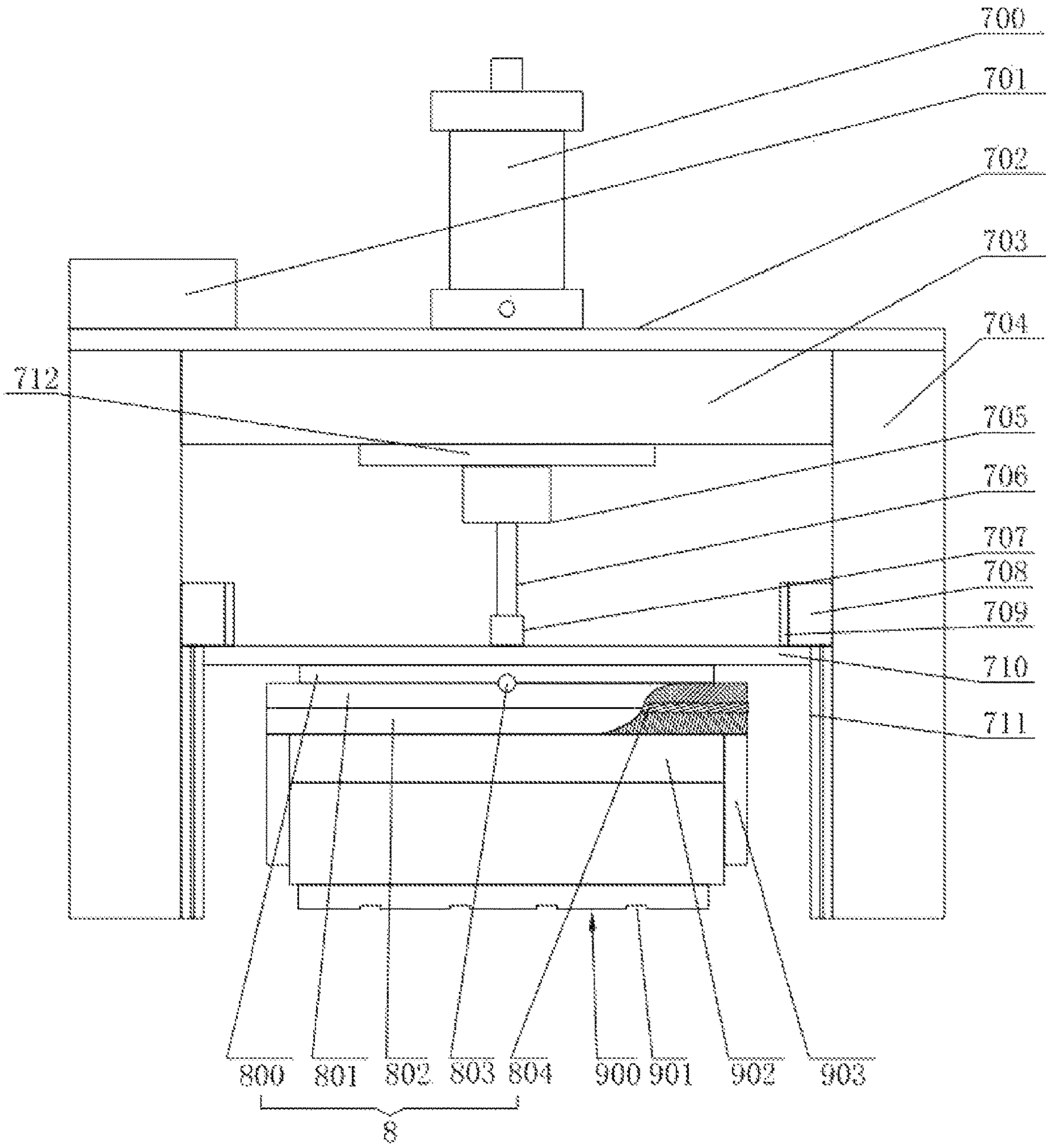
FIG. 12 is a schematic diagram of a hot-pressing module of the preparation device and process for an ACF bonding structure according to an embodiment of the present disclosure.

Referring to FIG. 12, the specific structure of the hot-pressing module is described below.

In the present disclosure, the hot-pressing module is configured to release a hot-pressing pressure, such that the second metal plate 13 is connected to the first metal plate 12 through the ACF to form a bonding structure.

Referring to FIG. 12, the hot-pressing module includes a part connected to the fine adjustment mechanism 8. The fine adjustment mechanism 8 enables the hot-pressing module to release the hot-pressing pressure in a balanced state, so as to keep flatness always consistent in a change from a low temperature to a high temperature when the bonding structure is hot-pressed.

Specifically, the fine adjustment mechanism 8 includes first plate 800 and second plate 801 connected to the first plate 800. The second plate 801 is connected to third plate 802. A first balancing member is connected between the first plate 800 and the second plate 801. A second balancing member is connected between the second plate 801 and the third plate 802.

Figure 15:
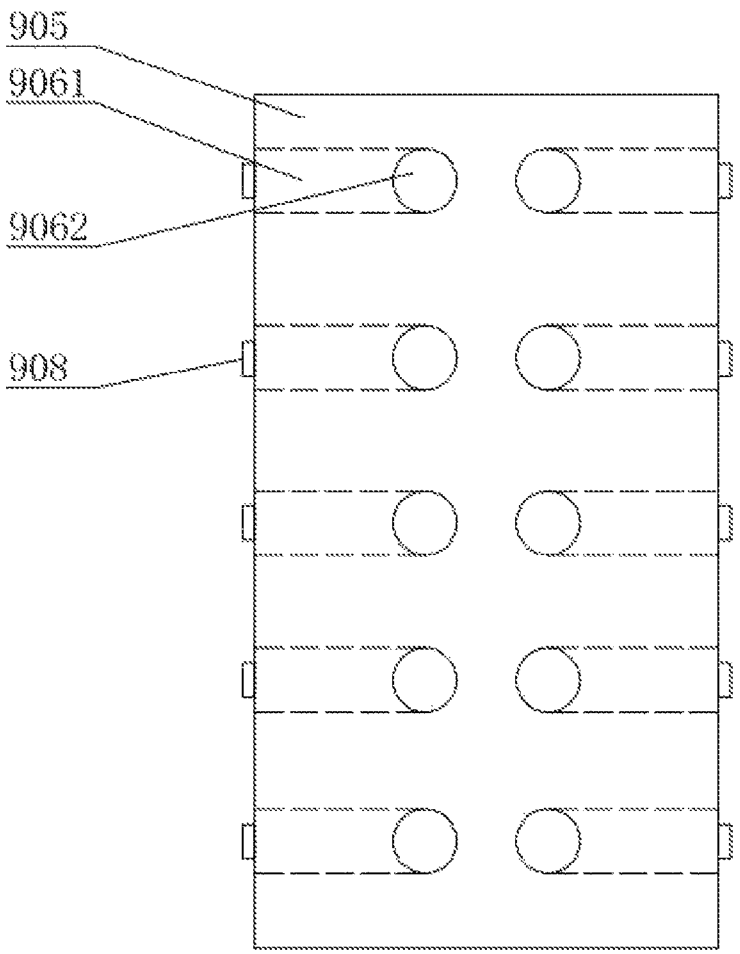
FIG. 15 is a partial view of an upper half of a fine adjustment mechanism of the preparation device and process for an ACF bonding structure according to a first embodiment of the present disclosure.
Figure 18:
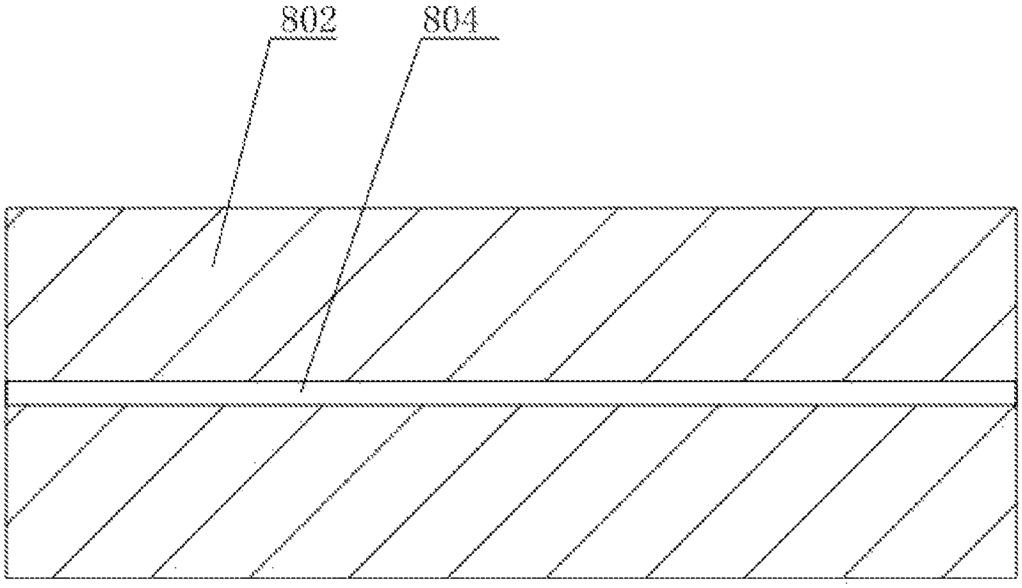
FIG. 18 is a partial view of a lower half of the fine adjustment mechanism of the preparation device and process for an ACF bonding structure according to the first embodiment of the present disclosure.

Referring to FIGS. 15 and 18, the first balancing member is first short shaft 803 provided along a short-side direction of the first plate 800, and the second balancing member is first long shaft 804 provided along a long-side direction of the third plate 802. A lower surface of the first plate 800 and an upper surface of the second plate 801 are respectively provided with semicircular shaft mounting holes. A lower surface of the second plate 801 and an upper surface of the third plate 802 are respectively provided with semicircular shaft mounting holes (not shown in the figure). The first long shaft 804 and the first short shaft 803 are inserted into the shaft mounting holes.

Still referring to FIGS. 11, 15, and 18, the first short shaft 803 ensures flatness of the first plate 800 and the second plate 801 in a left-right direction, and the first long shaft 804 ensures flatness of the second plate 801 and the third plate 802 in a front-back direction. In this way, the flatness and parallelism of the pressing part of the hot-pressing module are consistent, and the stress on the surface of the ACF is balanced after contacting the hot-pressing module, so as to avoid indentation during the hot-pressing process and effectively solve the problem of flatness variation of the bonding structure when the temperature changes from low to high.

Figure 16:
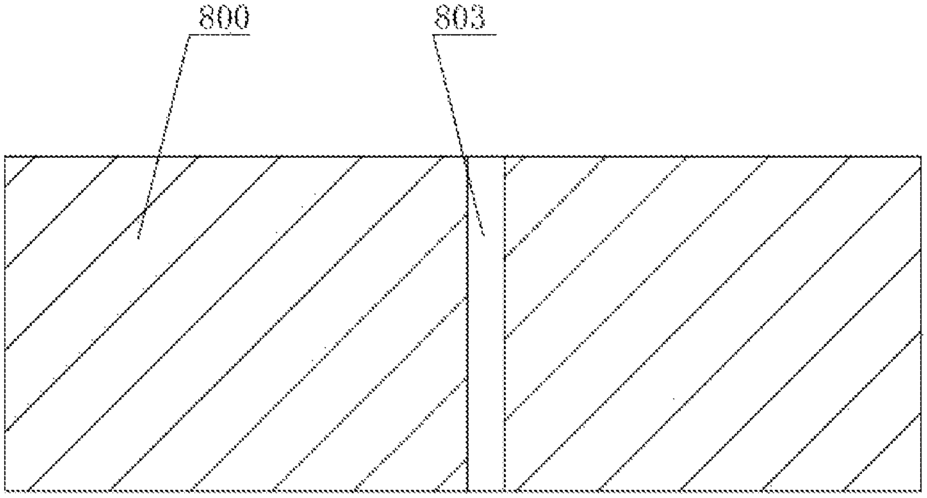
FIG. 16 is a partial view of the upper half of the fine adjustment mechanism of the preparation device and process for an ACF bonding structure according to a second embodiment of the present disclosure.
Figure 17:
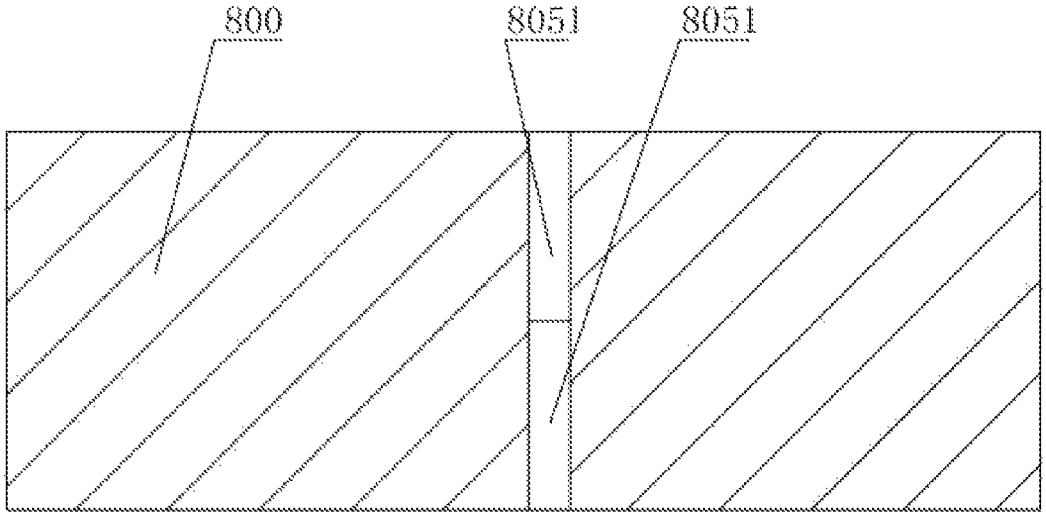
FIG. 17 is a schematic diagram of a second part of the preparation device and process for an ACF bonding structure according to an embodiment of the present disclosure.
Figure 19:
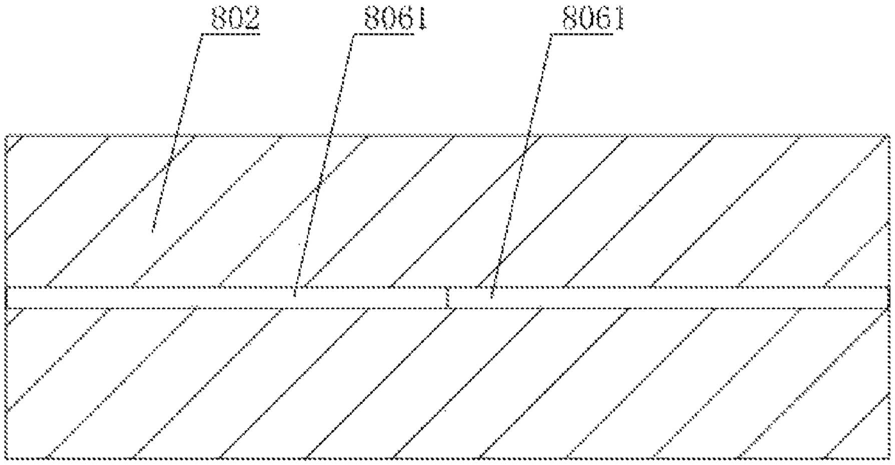
FIG. 19 is a partial view of the lower half of the fine adjustment mechanism of the preparation device and process for an ACF bonding structure according to the second embodiment of the present disclosure.
Figure 20:
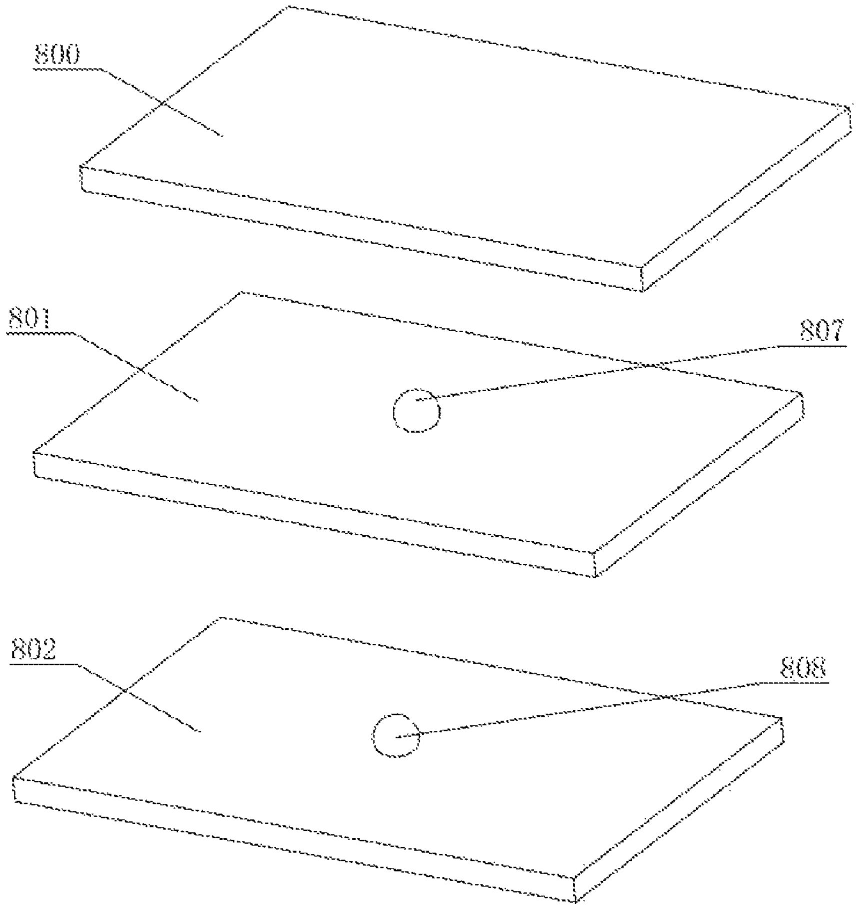
FIG. 20 is a partial view of the lower half of the fine adjustment mechanism of the preparation device and process for an ACF bonding structure according to a third embodiment of the present disclosure.

Correspondingly, in other embodiments of the present disclosure, referring to FIGS. 16 and 19, the first balancing member may also include two second short shafts 8051 butted with each other, and the second balancing member may also include two second long shafts 8061 butted with each other in the shaft mounting hole.

Correspondingly, in other embodiments of the present disclosure, the first balancing member may also be first sphere 807 provided between the first plate 800 and the second plate 801 and located at a center of the first plate 800 and the second plate 801. The second balancing member is a second sphere 808 provided between the second plate 801 and the third plate 802 and located at a center of the second plate 801 and the third plate 802. When the connection between the first plate 800 and the second plate 801 is loosened and the connection between the second plate 801 and the third plate 802 is loosened, the first sphere 807 and the second sphere 808 can adjust the position of each plate to make the flatness of the hot-pressing module connected to the fine adjustment mechanism 8 reach an ideal state, thus realizing convenient and quick adjustment.

Figure 13:
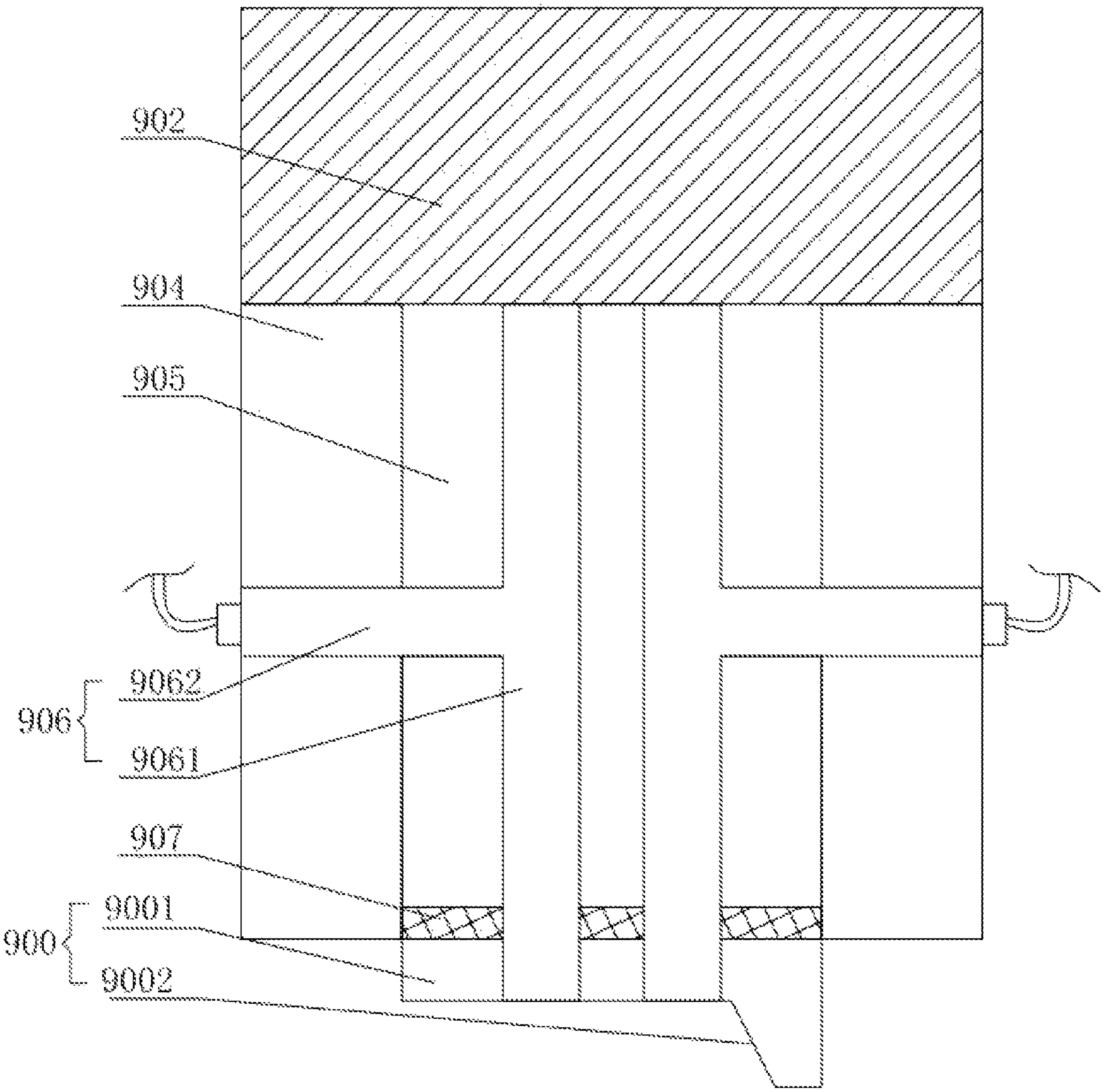
FIG. 13 is a schematic diagram of a heating module of the preparation device and process for an ACF bonding structure according to an embodiment of the present disclosure.

Referring to FIGS. 12 and 13, the hot-pressing module 8 includes a heat insulation part with an opening. The heat insulation part is a rectangular structure with opening, which is enclosed by first heat insulation element 902, two second heat insulation elements 903, and two third heat insulation elements 904. The first heat insulation element 902 is connected to the third plate 802. The rectangular structure with an opening is hollow inside, and the opening is closed by the heat conduction element 900. Therefore, the hollow interior of the rectangular structure forms an enclosed space filled with heating element 905. The heating element 905 is preferably made of SUS440C, that is, martensitic stainless steel, with good high-temperature stability. At least one heating tube 906 is provided in the heating element 905. The heating tube 906 is covered with multiple heating wires for electric heating. The heating tube 906 includes a part connected to the heat insulation part and another part connected to the heating element 905. The heating tube 906 is further internally connected to thermocouple 908. The thermocouple 908 is configured to measure a temperature of the heating tube 906.

The first heat insulation element 902, the second heat insulation elements 903, and the third heat insulation elements 904 further inhibit the upward heat conduction of the heating element 905 and the heating tube 906, thus avoiding heat loss. The heat always flows downward and towards the heat conduction element 900, such that the heat of the heat conduction element 900 is always kept within a reasonable range.

Further, the heating tube 906 is symmetrical with a central axis of the heating element 905. The heating tube 906 includes vertical first tube 9061 and horizontal second tube 9062 connected to the first tube 9061. The first tube 9061 includes one end extending to an upper surface of the heating element 905 and the other end extending to a lower surface of the heating element 905. The second tube 9062 extends to a side of the heating element 905. Most part of the heating element 905 is covered by the heating tube 906, which ensures the heat conduction performance of the heating element 905 and the heating tube 906, such that heat can be quickly and stably transferred to the heat conduction element 900.

Further, a connection between the heating element 905 and the heat conduction element 900 is further connected to thermal conductive silica gel film 907. The thermal conductive silica gel film 907 can improve the heat transfer efficiency and play the role of shock absorption, insulation, etc. In addition, the thermal conductive silica gel film 907 has a lower hardness, which increases the effective contact area of the thermal conductive silica gel film 907, thus reducing the loss of heat conduction.

Further, referring to FIG. 12, in this embodiment, the heat conduction element 900 is preferably made of a thermal conductive ceramic. The heat conduction element 900 includes first part 9001 and second part 9002 connected to the first part 9001. The first part 9001 is provided with a hole for assembling the heating tube 906. The second part 9002 extends in a vertical direction, and multiple grooves 901 are arranged on a surface of the second part 9002.

Figure 14:
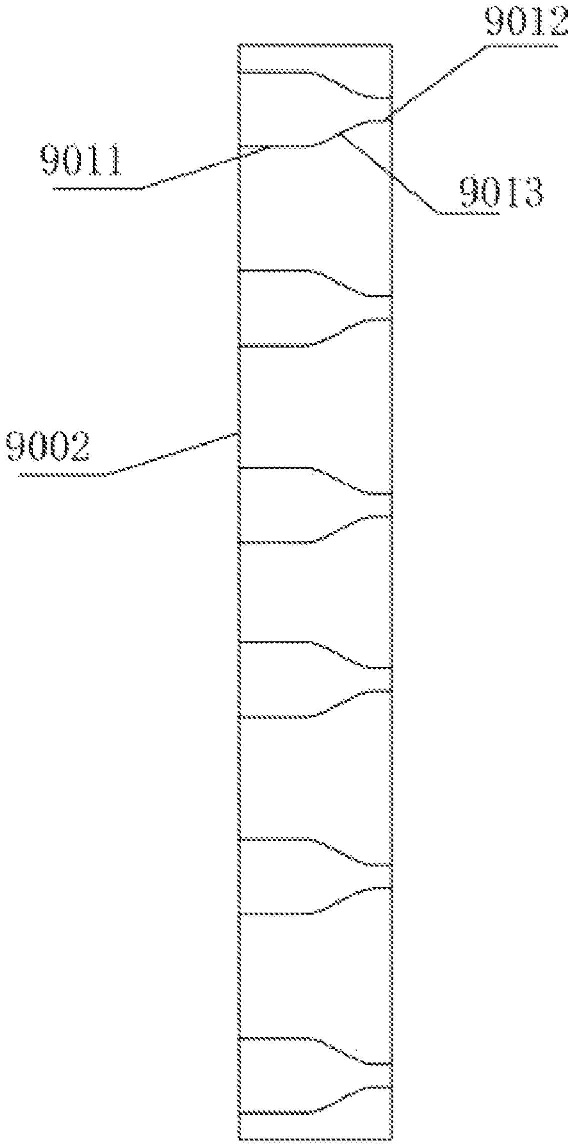
FIG. 14 is a partial view of the heating module of the preparation device and process for an ACF bonding structure according to an embodiment of the present disclosure.

Further, referring to FIG. 14, the groove 901 has first notch 9011 and second notch 9012 connected to the first notch. Tapered transition port 9013 is provided between the first notch 9011 and the second notch 9012. A width of the first notch 9011 is greater than that of the second notch 9012. Through the first notch 9011 with a larger width, local normal-temperature gas below the temperature of the heat conduction element 900 gathers at the first notch 9011 during downward hot-pressing. During further downward hot-pressing, the gas is accelerated at the tapered transition port 9013 and enters the second notch 9012. The second notch 9012 with a smaller width contributes to the largest gas flow is and the lowest temperature. In this way, the gas is further cooled as a cooling gas to impact the surface of the part to be hot-pressed. It generates heat exchange with the surface of the part to be hot-pressed to generate temperature gradient, further releasing local stress, avoiding thermal stress deformation on the bonding structure during hot pressing, thus improving the product yield.

Further, the groove 901 can also play a role of yielding and enabling point pressure contact for a bottom contact surface of the second part 9002. In addition, the groove 901 can further release local stress to avoid thermal stress deformation on the bonding structure during hot pressing, thus improving the product yield.

Further, referring to FIG. 12, an upper half of the first plate 800 in the fine adjustment mechanism 8 is further connected to second moving plate 710. Left and right ends of the second moving plate 710 each are connected to a fifth pneumatic sliding table. The fifth pneumatic sliding table includes fifth slider 708 and multiple fifth guide rails 711 connected to the fifth slider 708. The multiple fifth guide rails 711 are arranged on vertical beams 704. The fifth slider 708 is connected to the second moving plate 710 through connecting plate 709, such that when the second moving plate 710 moves up and down, it can drive the fifth slider 708 to slide along the fifth guide rails 711.

Further, referring to FIG. 12, an upper surface of the second moving plate 710 is further provided with punch 707. The punch 707 is integrated with a pressure sensor for feeding back a rated pressure to pressure gauge 701. The punch 707 is connected to pressing piston 706. An outer side of the pressing piston 706 is provided with guide seat 705 to ensure the stability of axial movement of the pressing piston 706. The pressing piston 706 defines an output end of pressing cylinder 700.

Further, referring to FIG. 12, the guide seat 705 is provided on guide plate 712. Left and right ends of the guide plate 712 are connected to side plates 703. The side plates 703 are connected between the adjacent vertical beams 704. A top of each of the side plates 703 is connected to horizontal beam 702.

Correspondingly, the present disclosure further provides a preparation process for an ACF bonding structure, which uses the above preparation device, and includes the following steps.

S1. Referring to FIG. 1, the first metal plate 12 is adsorbed on the surface of the adsorption plate 301.

Before the first metal plate 12 is adsorbed on the surface of the adsorption plate 301, the adsorption plate 301 and the first metal plate 12 need to be positioned as follows.

The positioning of the adsorption plate 301 is performed as follows. The positioning plates 405 of two second positioning modules 4 are respectively butted against one short side and one long side of the adsorption plate 301, and the second positioning module 4 located at the other short side of the adsorption plate 301 is started. The second cylinder body 400 drives the second piston connecting plate 404 to move through the piston 403, such that the third slider 402 slides relative to the third guide rail 401. During the movement, the positioning plate 405 gradually moves to butt against the short side of the adsorption plate 301, such that three sides of the adsorption plate 301 are positioned.

The positioning of the first metal plate 12 is performed as follows. The first metal plate 12 is placed on the surface of the adsorption plate 301. Referring to FIG. 4, the bent part of the first metal plate 12 is butted against one side of the adsorption plate 301. The vacuum generating device 304 is started to provide a vacuum adsorption force for each vacuum adsorption hole 302 to adsorb the first metal plate 12. The first positioning module 1 is started. Referring to FIG. 1, the first cylinder body 200 drives the first piston connecting plate 203 to move close to a long side of the adsorption plate 301 through the piston, and the first piston connecting plate 203 drives the second slider 202 to slide along the second guide rail 201. During the sliding, the fixed plate 204 connected to the first piston connecting plate 203 moves accordingly, such that the first positioning element 205 guides and presses the bent part of the first metal plate 12 through the second positioning groove 603. Similarly, the second positioning element 206 presses the bent part of the first metal plate 12 through the guide of the first positioning groove 602 to avoid the first metal plate 12 from deviating during production. The bent part of the first metal plate 12 is always butted against the side surface of the adsorption plate 301 to reduce the deformation and increase the strength during hot-pressing.

Figure 21:
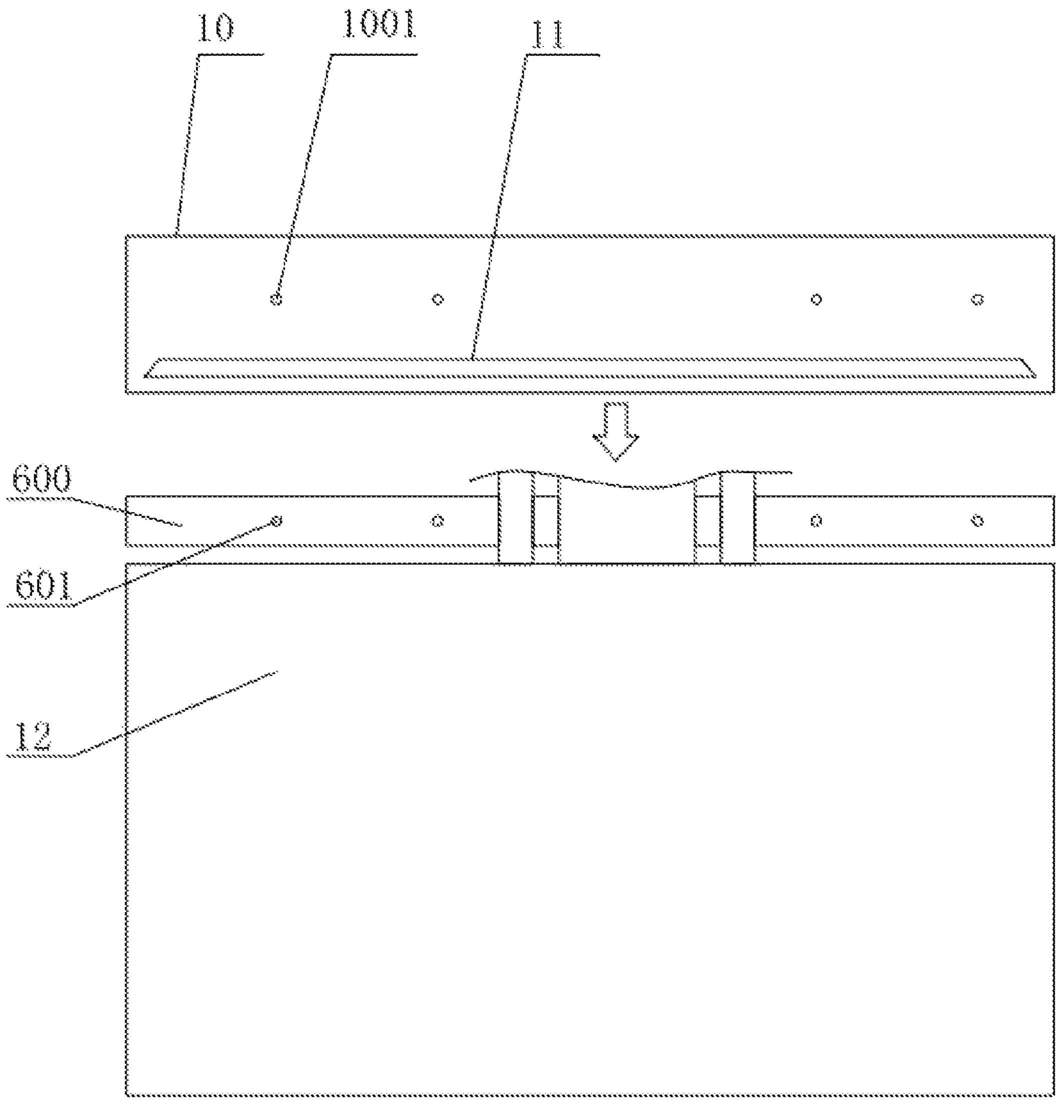
FIG. 21 is a schematic diagram of a transfer film with an ACF and a first metal plate, before connection, of the preparation device and process for an ACF bonding structure according to an embodiment of the present disclosure.
Figure 22:
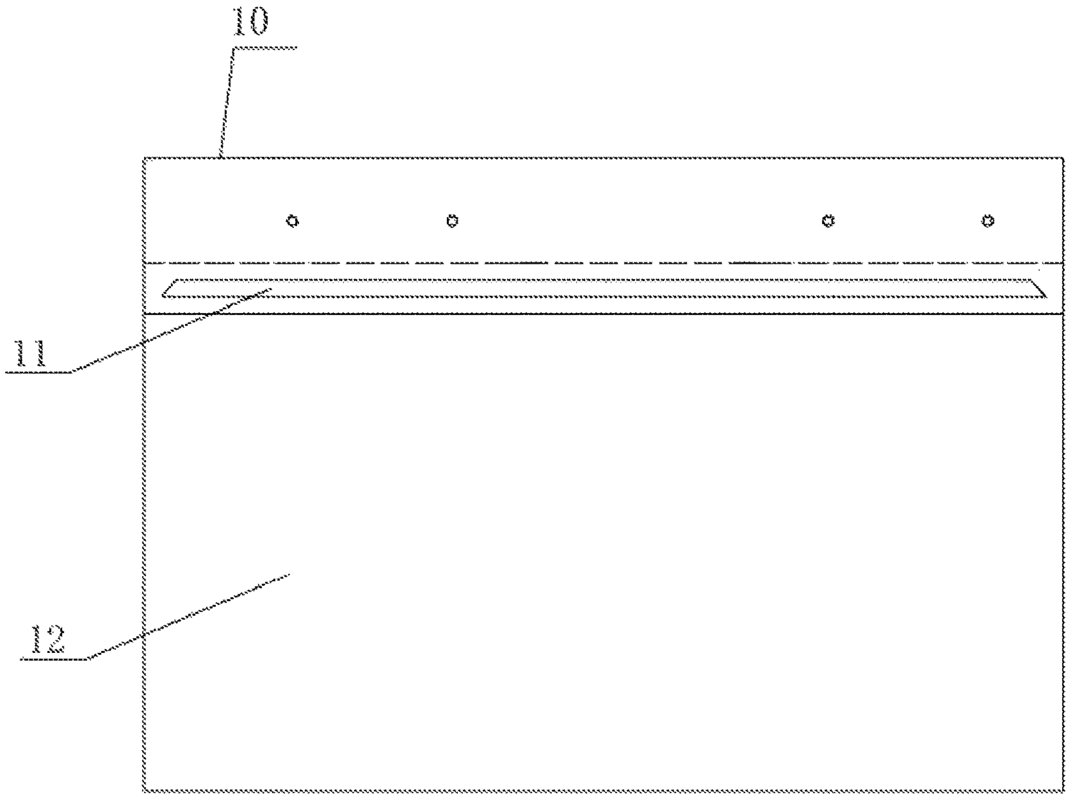
FIG. 22 is a schematic diagram of the transfer film with the ACF and the first metal plate, before connection, of the preparation device and process for an ACF bonding structure according to an embodiment of the present disclosure.

S2. Referring to FIG. 21, after the positioning of the first metal plate 12 is completed, the transfer film 10 with the ACF 11 is positioned with the orientation plate 6. Specifically, the transfer film positioning hole 1001 of the transfer film 10 corresponds to the third positioning hole 601 of the orientation plate 6. The ACF 11 and the first metal plate 12 are positioned through the transfer film positioning hole 1001. Referring to FIG. 22, after a positioning pin is inserted, the transfer film 10 is manually torn off such that the ACF 11 covers the surface of the first metal plate 12.

S3. The hot-pressing module prepresses the ACF 11 to bond the ACF 11 with the first metal plate 12.

Specifically, referring to FIG. 1, the driving device 103 drives the screw rod 104 to rotate, such that the nut 104 moves linearly relative to the screw rod 104. In this way, the first moving plate 106 and the mounting plate 14 connected to the first moving plate 106 are driven to move to a position directly below the hot-pressing module.

Referring to FIG. 11, after the position is confirmed, the pressing cylinder 700 controls the pressing piston 706 to drive the punch 707 downward. The punch 707 drives the second moving plate 710 to control the fifth slider 708 to move downward along the fifth guide rail 711 during the downward movement, such that the hot-pressing module goes downward as a whole. Before the hot-pressing module goes downward, the heat of the heating wire in the heating tube 906 is released. The heat of the heating tube 906 accumulates in the heating element 905 and is completely transferred to the heat conduction element 900 through the thermal conductive silica gel film 907. The heat conduction temperature of the heat conduction element 900 is preferably 250° C. A force required for each square millimeter of the ACF 11 is about 0.3 N. That is, the prepressing force of the pressing cylinder 700 is controlled to be 200 N. After the heat conduction element 900 contacts the ACF 11, the ACF is pressed for 5 s. Then the pressing cylinder 700 is lifted, and the ACF 11 is bonded with the first metal plate 12.

Figure 23:
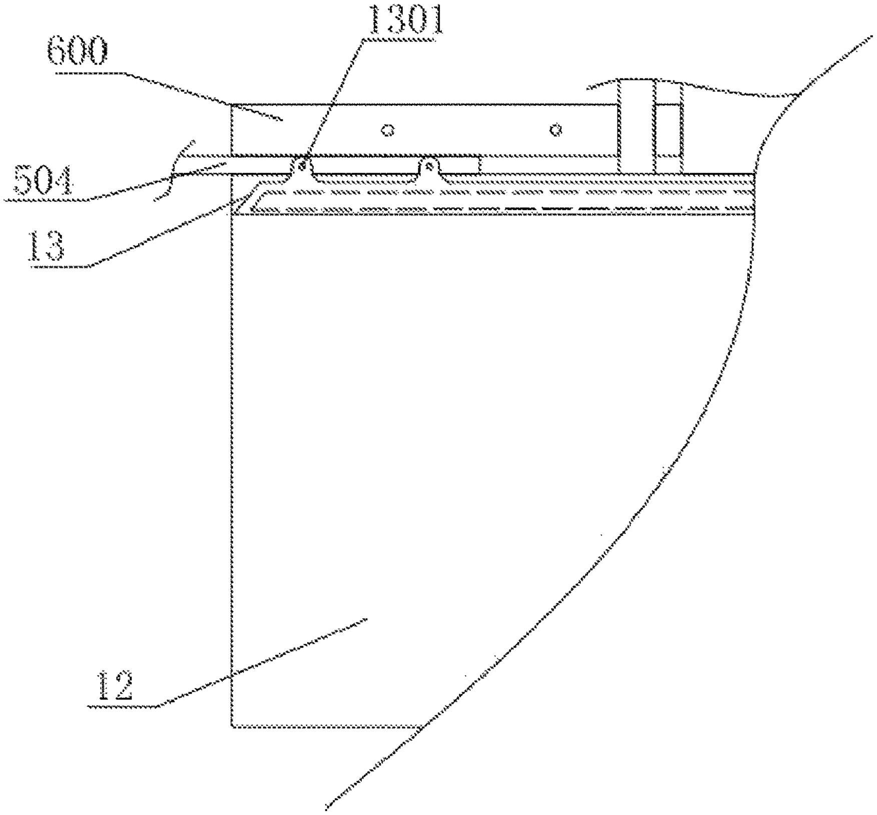
FIG. 23 is a schematic diagram of a connection relationship of a second metal plate, the ACF and the first metal plate of the preparation device and process for an ACF bonding structure according to an embodiment of the present disclosure.

S4. Referring to FIG. 23, the second metal plate 13 covers the surface of the ACF 11. Specifically, the second metal plate 13 is provided with multiple second metal plate positioning holes 1301. Referring to FIGS. 8, 9, and 23, the third cylinder body 500 is started, and the piston rod 505 is driven to retract. After the piston rod 505 is retracted, the third piston connecting plate 506 drives the fourth slider 501 to go upward relative to the fourth guide rail 502, so as to lift the third positioning plate 504. After the third positioning plate 504 is lifted, it is positioned with and connected to the second metal plate positioning hole 1301 of the second metal plate 13 through the movable positioning post 503 and the fixed positioning post 507. The diameters of the fixed positioning post 507 and the movable positioning post 503 are slightly smaller than the diameter of the second metal plate positioning hole 1301. When the positioning is completed, the mounting plate 14 is again controlled to move to the position below the hot-pressing module through the transfer assembly 1.

The hot-pressing module goes downward as a whole. When the heat conduction element 700 contacts the surface of the second metal plate 13, the third cylinder body 500 is started, and the piston rod 505 is driven to extend. When the piston rod 505 is extended, the third piston connecting plate 506 drives the fourth slider 501 to go downward relative to the fourth guide rail 502. The positioning plate 504 is lowered, and each positioning post is separated from the second metal plate positioning hole 1301 to avoid affecting the hot-pressing effect. During the pressing process, a heat conduction temperature of the heat conduction element 900 is preferably 300° C. A force required for each square millimeter of the ACF 11 is about 0.3 N, that is, the prepressing force of the pressing cylinder 700 is controlled to be 900 N. After the heat conduction element 900 contacts the ACF 11, the ACF is pressed for 5 s. Then the pressing cylinder 700 is lifted, and the second metal plate 13, the ACF 11, and the first metal plate 12 are hot-pressed to form a bonding structure.

Finally, the bonding structure is manually taken out.

In other embodiments of the present disclosure, the ACF can also be a thermosetting composite conductive film. The hot-pressing process of the thermosetting composite conductive film is the same as that of the ACF, and will not be repeated herein.

The technical features of the foregoing embodiments can be employed in arbitrary combinations. For brevity of description, not all possible combinations of the technical features of the foregoing embodiments are described. However, the combinations of the technical features should be construed as falling within the scope described in this specification as long as there is no contradiction in the combinations.

Only several embodiments of the present disclosure are described in detail above, but they should not therefore be construed as limiting the scope of the present disclosure. It should be noted that those of ordinary skill in the art can further make several variations and improvements without departing from the concept of the present disclosure, and all of these fall within the protection scope of the present disclosure. Therefore, the protection scope of the present disclosure shall be subject to the protection scope defined by the claims.

What is claimed is:

1. A preparation device for an anisotropic conductive film (ACF) bonding structure, comprising a negative-pressure adsorption device, a positioning assembly, and a hot-pressing module, wherein the negative-pressure adsorption device is configured to adsorb a first metal plate, and the negative-pressure adsorption device comprises an adsorption plate and a plurality of vacuum adsorption holes provided in the adsorption plate; and the plurality of vacuum adsorption holes are jointly connected to a vacuum generating device through a vacuum channel;

the positioning assembly comprises a first positioning module, at least two second positioning modules, and at least one third positioning module; the first positioning module is configured to position the first metal plate; the at least two second positioning modules are configured to position at least one part of the negative-pressure adsorption device; and the third positioning module is configured to position a second metal plate;

the hot-pressing module is configured to release a hot-pressing pressure, such that the second metal plate is connected to the first metal plate through an ACF to form a bonding structure;

the hot-pressing module comprises a heat insulation part with an opening; the opening of the heat insulation part is closed by a heat conduction element; an enclosed space is formed between an inner side of the heat insulation part and an inner side of the heat conduction element, and the enclosed space is provided therein with a heating element; the heating element is provided therein with at least one heating tube; the at least one heating tube comprises a first part connected to the heat insulation part and a second part connected to the heating element; an interior of the at least one heating tube is further connected to a thermocouple; and a thermal conductive silica gel film is provided at a connection between the heating element and the heat conduction element; and the heat conduction element comprises a first part and a second part integrally connected to the first part; the second part protrudes from a side of the first part; a surface of the second part is provided with at least one groove comprising a first notch and a second notch; the first notch has a width larger than a width of the second notch; and a tapered transition port is provided between the first notch and the second notch.

2. The preparation device for the ACF bonding structure according to claim 1, wherein the hot-pressing module comprises a part connected to a fine adjustment mechanism; the fine adjustment mechanism enables the hot-pressing module to release the hot-pressing pressure in a balanced state, and the fine adjustment mechanism comprises a first plate and a second plate connected to the first plate; the second plate is connected to a third plate; a first balancing member is connected between the first plate and the second plate; and a second balancing member is connected between the second plate and the third plate.

3. The preparation device for the ACF bonding structure according to claim 2, wherein the first balancing member comprises at least a first shaft provided along a short side or a long side of the first plate; and the second balancing member comprises at least a second shaft provided along a short side or a long side of the second plate.

4. The preparation device for the ACF bonding structure according to claim 2, wherein the first balancing member is a first sphere provided between the first plate and the second plate and located at a center of the first plate and the second plate; and the second balancing member is a second sphere provided between the second plate and the third plate and located at a center of the second plate and the third plate.

5. The preparation device for the ACF bonding structure according to claim 1, wherein the plurality of vacuum adsorption holes each comprise a first hole and a second hole communicated with the first hole; a diameter of the first hole decreases towards a surface of the adsorption plate; the first hole is provided therein with an airflow tube; the airflow tube comprises a first end connected to a wall of the second hole through at least two elastic elements and a second end connected to a spacer; and the spacer is provided with a vortex hole.

6. The preparation device for the ACF bonding structure according to claim 1, wherein the negative-pressure adsorption device and the positioning assembly are arranged on a mounting plate; the mounting plate is connected to a first moving plate; the first moving plate is connected to a first part of at least two first pneumatic sliding tables; a second part of the at least two first pneumatic sliding tables is connected to a bottom plate; and the first moving plate is further connected to an output end of a driving device through a transmission mechanism.

7. The preparation device for the ACF bonding structure according to claim 1, wherein the first positioning module comprises a second pneumatic sliding table and a first piston connecting plate connected to a part of the second pneumatic sliding table; the first piston connecting plate comprises a first part connected to a first cylinder body and a second part connected to a first part of a fixed plate, and a second part of the fixed plate is connected to a first positioning element and at least one second positioning element; a width of the at least one second positioning element is smaller than a width of the first positioning element; the first positioning element and the at least one second positioning element are connected to an orientation plate; and the orientation plate is provided with at least one positioning hole; and the at least two second positioning modules each comprise a second cylinder body and a third pneumatic sliding table connected to the second cylinder body; a part of the third pneumatic sliding table is connected to a piston through a second piston connecting plate; and the second piston connecting plate is connected to a positioning plate.

8. The preparation device for the ACF bonding structure according to claim 2, wherein the fine adjustment mechanism further comprises a part connected to a second moving plate; left and right sides of the second moving plate each are connected to a fifth pneumatic sliding table; a surface of the second moving plate is connected to a pressing piston through a punch; an outer side of the pressing piston is provided with a guide seat; and the pressing piston is connected to a pressing cylinder.

9. A preparation process for an ACF bonding structure, using the preparation device according to claim 1, and comprising the following steps:

adsorbing, by the negative-pressure adsorption device, the first metal plate;

positioning, by an orientation plate, a transfer film with the ACF; covering, by the transfer film with the ACF, a surface of the first metal plate; and tearing off the transfer film, such that the ACF covers the surface of the first metal plate;

prepressing, by the hot-pressing module, the ACF, such that the ACF is bonded with the first metal plate;

positioning, by the third positioning module, the second metal plate, such that the second metal plate covers a surface of the ACF;

pressing, by the hot-pressing module, the second metal plate, such that the second metal plate, the ACF, and the first metal plate are hot-pressed to form the bonding structure; and taking the bonding structure out.

10. The preparation process for the ACF bonding structure according to claim 9, wherein the hot-pressing module comprises a part connected to a fine adjustment mechanism; the fine adjustment mechanism enables the hot-pressing module to release the hot-pressing pressure in a balanced state, and the fine adjustment mechanism comprises a first plate and a second plate connected to the first plate; the second plate is connected to a third plate; a first balancing member is connected between the first plate and the second plate; and a second balancing member is connected between the second plate and the third plate.

11. The preparation process for the ACF bonding structure according to claim 10, wherein the first balancing member comprises at least a first shaft provided along a short side or a long side of the first plate; and the second balancing member comprises at least a second shaft provided along a short side or a long side of the second plate.

12. The preparation process for the ACF bonding structure according to claim 10, wherein the first balancing member is a first sphere provided between the first plate and the second plate and located at a center of the first plate and the second plate; and the second balancing member is a second sphere provided between the second plate and the third plate and located at a center of the second plate and the third plate.

13. The preparation process for the ACF bonding structure according to claim 9, wherein the plurality of vacuum adsorption holes each comprise a first hole and a second hole communicated with the first hole; a diameter of the first hole decreases towards a surface of the adsorption plate; the first hole is provided therein with an airflow tube; the airflow tube comprises a first end connected to a wall of the second hole through at least two elastic elements and a second end connected to a spacer; and the spacer is provided with a vortex hole.

14. The preparation process for the ACF bonding structure according to claim 9, wherein the negative-pressure adsorption device and the positioning assembly are arranged on a mounting plate; the mounting plate is connected to a first moving plate; the first moving plate is connected to a first part of at least two first pneumatic sliding tables; a second part of the at least two first pneumatic sliding tables is connected to a bottom plate; and the first moving plate is further connected to an output end of a driving device through a transmission mechanism.

15. The preparation process for the ACF bonding structure according to claim 9, wherein the first positioning module comprises a second pneumatic sliding table and a first piston connecting plate connected to a part of the second pneumatic sliding table; the first piston connecting plate comprises a first part connected to a first cylinder body and a second part connected to a first part of a fixed plate, and a second part of the fixed plate is connected to a first positioning element and at least one second positioning element; a width of the at least one second positioning element is smaller than a width of the first positioning element; the first positioning element and the at least one second positioning element are connected to the orientation plate; and the orientation plate is provided with at least one positioning hole; and the at least two second positioning modules each comprise a second cylinder body and a third pneumatic sliding table connected to the second cylinder body; a part of the third pneumatic sliding table is connected to a piston through a second piston connecting plate; and the second piston connecting plate is connected to a positioning plate.

16. The preparation process for the ACF bonding structure according to claim 10, wherein the fine adjustment mechanism further comprises a part connected to a second moving plate; left and right sides of the second moving plate each are connected to a fifth pneumatic sliding table; a surface of the second moving plate is connected to a pressing piston through a punch; an outer side of the pressing piston is provided with a guide seat; and the pressing piston is connected to a pressing cylinder.

17. A preparation process for a thermosetting composite conductive film bonding structure, using the preparation device according to claim 1, and comprising the following steps:

adsorbing, by the negative-pressure adsorption device, the first metal plate;

positioning, by an orientation plate, a transfer film with a thermosetting composite conductive film; covering, by the transfer film with the thermosetting composite conductive film, a surface of the first metal plate; and tearing off the transfer film, such that the thermosetting composite conductive film covers the surface of the first metal plate;

prepressing, by the hot-pressing module, the thermosetting composite conductive film, such that the thermosetting composite conductive film is bonded with the first metal plate;

positioning, by the third positioning module, the second metal plate, such that the second metal plate covers a surface of the thermosetting composite conductive film;

pressing, by the hot-pressing module, the second metal plate, such that the second metal plate, the thermosetting composite conductive film, and the first metal plate are hot-pressed to form the bonding structure; and taking the bonding structure out.

* * * * *